United States Patent [19]

Sakai et al.

[11] Patent Number: 4,943,509
[45] Date of Patent: Jul. 24, 1990

[54] RECORDING SYSTEM HAVING A COATING DEVICE FOR COATING RECORDING MEDIUM OR PHOTOSENSITIVE MEDIUM WITH DEVELOPER MATERIAL REACTING WITH COLOR PRECURSOR

[75] Inventors: Jun Sakai; Shunichi Higashiyama, both of Nagoya; Koji Suzuki, Kasugai; Mitsuru Ohta, Nagoya, all of Japan

[73] Assignee: Brother Kogyo Kabushiki Kaisha, Aichi, Japan

[21] Appl. No.: 159,736

[22] Filed: Feb. 24, 1988

[30] Foreign Application Priority Data

Feb. 27, 1987 [JP] Japan ................................. 62-45687
Feb. 27, 1987 [JP] Japan ................................. 62-45690
Jun. 17, 1987 [JP] Japan ................................. 62-150901
Aug. 6, 1987 [JP] Japan ................................. 62-196669

[51] Int. Cl.$^5$ ................................................. G03C 1/40
[52] U.S. Cl. ................................. 430/138; 428/402.2
[58] Field of Search ............................ 430/138, 235; 428/402.2

[56] References Cited

U.S. PATENT DOCUMENTS

| 4,399,209 | 8/1983 | Sanders et al. ........................ 430/138 |
| 4,440,846 | 4/1984 | Sanders et al. ........................ 430/138 |
| 4,554,235 | 11/1985 | Adair et al. ........................... 430/138 |
| 4,701,397 | 10/1987 | Rourke et al. ......................... 430/138 |
| 4,770,971 | 9/1988 | Sakai .................................... 430/138 |
| 4,782,003 | 11/1988 | Yoshihara ............................. 430/138 |

FOREIGN PATENT DOCUMENTS

| 164931 | 12/1985 | European Pat. Off. . |
| 921673 | 3/1963 | United Kingdom . |
| 998011 | 7/1965 | United Kingdom . |
| 1013101 | 12/1965 | United Kingdom . |
| 2112536 | 11/1981 | United Kingdom . |
| 2111232 | 11/1982 | United Kingdom . |
| 2172123 | 2/1986 | United Kingdom . |
| 2172711 | 9/1986 | United Kingdom . |
| 2187298 | 9/1987 | United Kingdom . |

*Primary Examiner*—John L. Goodrow
*Attorney, Agent, or Firm*—Oliff & Berridge

[57] ABSTRACT

A recording system including an exposing device for image-wise exposing a pressure-sensitive photosensitive medium according to source image information, so as to form thereon latent images, and a developing device for applying a pressure to the image-wise exposed photosensitive medium so as to cause a chemical reaction with a developer material, to thereby develop the latent images into visible images on a recording medium. The recording system further includes a coating device for applying the developer material to the recording medium.

19 Claims, 6 Drawing Sheets

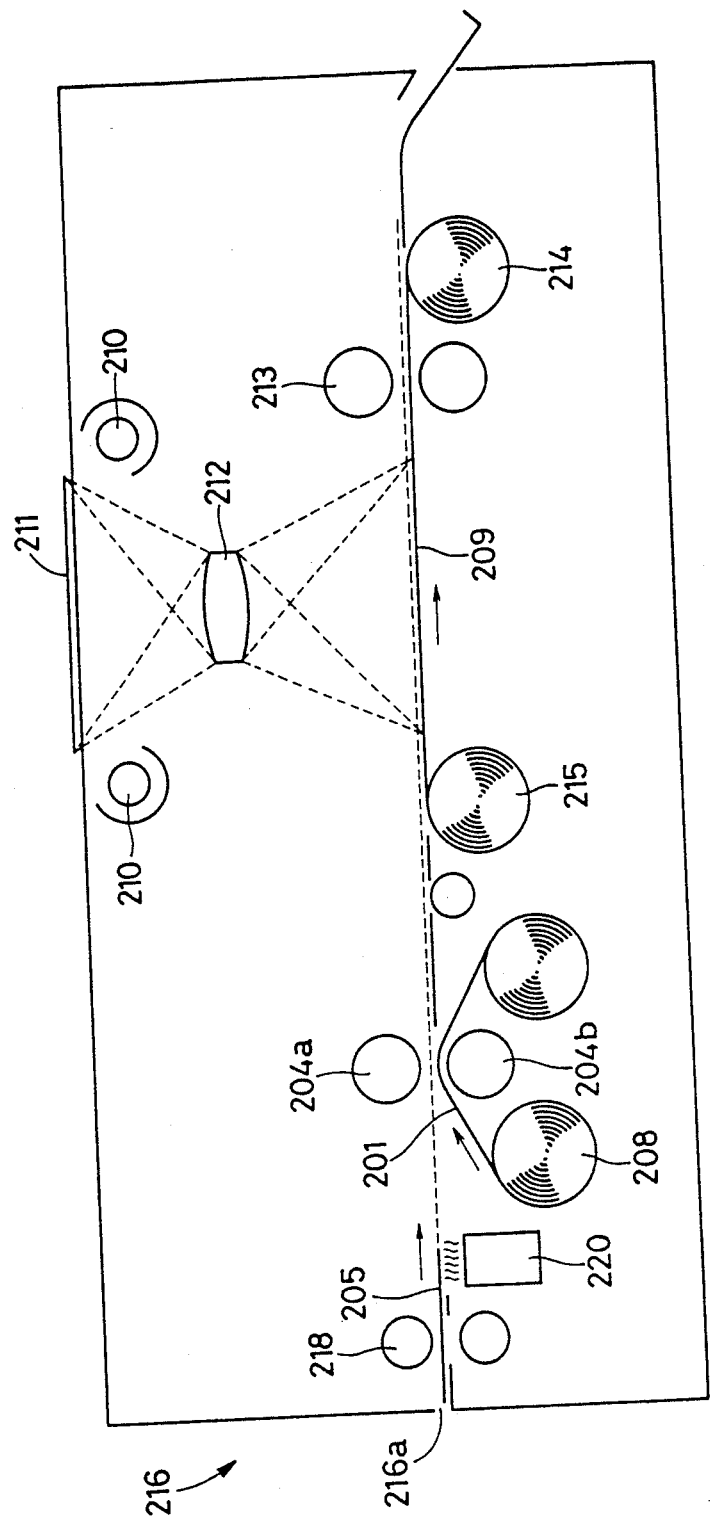

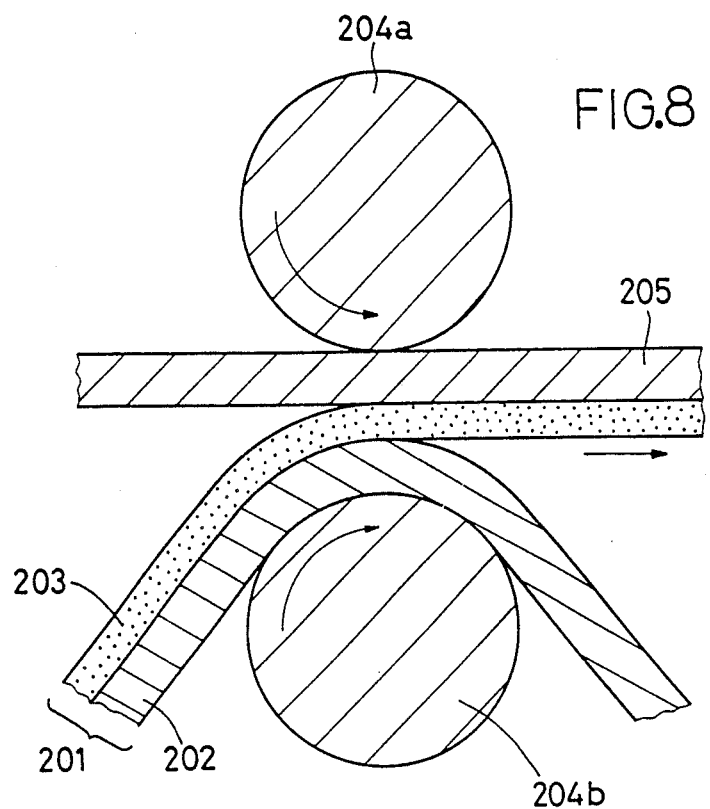

RECORDING SYSTEM HAVING A COATING DEVICE FOR COATING RECORDING MEDIUM OR PHOTOSENSITIVE MEDIUM WITH DEVELOPER MATERIAL REACTING WITH COLOR PRECURSOR

BACKGROUND OF THE INVENTION

1. Field of the Invention

The present invention relates to a recording system or an image transfer system which includes an exposing device for image-wise exposing a pressure-sensitive photosensitive medium having a layer of a chromogenic material or color precursor, so as to form latent images corresponding to desired source image information, and a developing device for applying a pressure to the image-wise exposed photosensitive medium so as to cause a chemical reaction with a developer material provided on the photosensitive medium or on a separate recording medium, so that the latent images are developed into visible images.

2. Discussion of the Prior Art

In a known recording system of the type indicated above, a chromogenic material or color precursor capable of reacting with a developer material so as to produce a color image is contained in each of a multiplicity of microcapsules which constitute a microcapsule layer on a pressure-sensitive photosensitive medium. In one form of this type of photosensitive medium, the microcapsules further contain a resin which supports the chromogenic material and whose mechanical strength is varied upon exposure to a radiation. In another form of the photosensitive medium, the mechanical strength of the microcapsules containing the chromogenic material is varied upon exposure to a radiation. In either case, the microcapsules whose mechanical strength after exposure to a radiation is comparatively low are ruptured, to permit the chromogenic material to come out from the ruptured microcapsules, whereby the chromogenic material chemically reacts with the developer material, so as to produce a color image.

The developer material is provided either as a developer layer formed on the substrate of a photosensitive medium, or alternatively as a separate developer sheet which is superposed on the photosensitive medium when the latent images on the photosensitive medium are developed into the visible images on the developer sheet. In the former case, the visible images are formed on the photosensitive medium having the developer layer. This type of photosensitive medium is a so-called "self-activated" type. In the latter case, the photosensitive medium is used as a transfer sheet while the developer sheet is used as a recording medium on which the visible images are eventually formed. This latter arrangement is referred to as a "separate" type.

An example of the self-activated type of photosensitive medium is disclosed in U S. Pat. No. 4,440,846, while an example of the separate type is disclosed in U.S. Pat. No. 4,399,209.

In both cases indicated above, the photosensitive medium having a microcapsule layer is image-wise exposed in a suitable manner. For example, the photosensitive medium is exposed to a radiation which is reflected by an original bearing desired source image information, or which is transmitted through the original. In the former case, the photosensitive medium and the original may be held in close contact with each other. The developing device for pressing the image-wise exposed photosensitive medium may use suitable pressing means such as presser rollers, impact head, or rotating balls.

As indicated above, the known recording system of the type described uses either a self-activated photosensitive recording medium, or a combination of a photosensitive medium without a developer layer and a separate recording medium with a developer layer. In either case, therefore, the user of the recording system has to use the exclusively designed photosensitive recording medium or developer sheet, on which desired images are eventually formed. In other words, the user cannot copy desired images on a desired recording medium such as commercially available ordinary papers, postcards, fabrics, plastic films or sheets, or other planar members made of other materials. If the user wishes to have the desired images formed on a desired recording medium, the images must be first formed on a self-activated photosensitive medium or a developer sheet, and the imaged medium or sheet must then be bonded to the surface of the desired medium such as a postcard. This procedure is time-consuming, and results in the finally obtained medium having an increased thickness.

SUMMARY OF THE INVENTION

It is therefore an object of the present invention to provide a recording system which permits desired images to be easily formed on a desired recording medium, by using a pressure-sensitive photosensitive medium having a chromogenic material which reacts with a developer material.

The above object may be attained according to the principle of the present invention, which provides a recording system including an exposing device for image-wise exposing a pressure-sensitive photosensitive medium according to source image information, so as to form thereon latent images, and a developing device for applying a pressure to the image-wise exposed photosensitive medium so as to cause a chemical reaction with a developer material, to thereby develop the latent images into visible images on a recording medium, wherein a coating device is provided for applying the developer material to the recording medium.

In the recording system of the present invention constructed as described above, a desired recording medium such as a postcard or plastic film is coated with a layer of the developer material, by the coating device, and the developer material chemically reacts with the chromogenic material or color precursor of the photosensitive medium which has been image-wise exposed by the exposing device. Therefore, the images corresponding to the source image information may be formed on the desired recording medium, when the image-wise exposed photosensitive medium is subjected to a developing process which involves the pressure application to cause the chemical reaction between the chromogenic material and the developer material. Thus, the instant recording system permits desired images to be formed on a desired recording medium.

In one form of the recording system of the invention, the developing device includes a device for superposing the recording medium on the photosensitive medium after the latent images are formed on the photosensitive medium by the exposing device, and for pressing the superposed recording medium and photosensitive medium, to thereby transfer the latent images from the photosensitive medium to the recording medium. In this case, the developing device includes the coating device, which is adapted to apply the developer material to the recording medium to which the latent images have been transferred from the photosensitive medium. In other words, the developer material is applied to the recording medium after the chromogenic material is imagewise transferred from the photosensitive medium to the recording medium. The developer material applied to the recording medium chemically reacts with the chromogenic material already transferred to the recording medium, whereby the latent images are developed into the visible images on the desired recording medium. According to the instant recording system, a desired number of copies of an original may be produced on a desired copy sheet or recording medium. If the coating device and the mechanism to feed the photosensitive medium are constructed as compact cartridge units, the required maintenance procedure can be simplified.

In another form of the instant recording system, the developing device also includes a device for superposing the desired recording medium on the photosensitive medium after the latent images are formed on the photosensitive medium by the exposing device, and for pressing the superposed recording medium and photosensitive medium, to thereby develop the latent images into the visible images. In this case, the developing device includes the coating device, which is adapted to apply the developer material to the recording medium before the recording medium is superposed on the photosensitive medium. Namely, the coating device incorporated in the recording system as a part of the developing device may be considered as a device for preparing a developer sheet on which the developer layer is formed and on which desired images are eventually formed.

In a further form of the present recording system, the pressure-sensitive photosensitive medium functions as the recording medium, and the coating device is adapted to apply the developer material to the photosensitive medium on which the images are eventually formed. In this instance, the photosensitive medium is considered as a desired recording medium which is commercially available. Since the photosensitive medium is processed into a self-activated photosensitive medium only after the medium is used on the recording system, there is no possibility of an otherwise possible chemical reaction between the developer material and the chromogenic material, which would occur on the conventional self-activated photosensitive medium.

In the above form of the invention, the developing device may further include a device for forming a layer of microcapsules on the substrate of the photosensitive medium. Each microcapsule contains the chromogenic material or color precursor. The microcapsules are sensitive to a radiation such that their mechanical strength is changed depending upon an amount of radiation to which the microcapsules are exposed.

In a still further form of the present invention, the photosensitive medium is sensitive to different wavelengths of radiation, and the exposing device imagewise exposes the photosensitive medium to the different wavelengths of radiation, to produce color images when the latent images are developed by the developing device.

The developer material applied to the recording medium by the coating device may be contained in a liquid, or take the form of a powder. The coating device may uses a removable reservoir for accommodating the developer material.

In still another form of the instant recording system, the coating device is adapted to act on a developer sheet which includes a developer layer containing the developer material and a substrate supporting the developer layer. The coating device includes transfer means for transferring the developer layer from the developer sheet to the desired recording medium, by forcing the developer layer against the recording medium. According to this arrangement, the desired recording medium coated with the developer layer is superposed on the image-wise exposed photosensitive medium, and the latent images on the exposed photosensitive medium are developed into the visible images on the recording medium when the superposed media are pressed by the developing device. In this arrangement, too, desired images may be directly formed on a desired recording medium such as a postcard or an ordinary cut sheet, without bonding a separately prepared imaged sheet to the desired recording medium.

In the above form of the invention, the coating device may include one or more presser rollers forcing the developer sheet against the recording medium while heating the developer sheet and the recording medium. For facilitating the transfer of the developer layer from the developer sheet to the recording medium, at least one of the developer sheet and the recording medium may be humidified as with a water vapor by a suitable humidifying device. The developer layer may be formed from a liquid which is cast on a surface of the substrate, the liquid containing the developer material in the form of a developer agent capable of reacting with a color precursor on the recording medium, and further containing a binder.

It is another object of the present invention to provide a toner for forming a developer medium having a developer layer, which developer medium is used as a recording medium.

This second object may be achieved according to another aspect of the present invention, which provides a toner for forming a developer medium, containing as major components a developer material capable of reacting with a chromogenic material to produce a color image, and a thermoplastic resin. The toner may be applied to a desired substrate or recording medium in a suitable manner, preferably by an electrostatic or electromagnetic method, either after or before latent images are developed into visible images by a developing device. Preferably, the toner applied to the substrate or recording medium is heated for fixation.

The developer material may consist of at least one material selected from the group consisting of (a) electron accepter compounds selected from the group which includes (i) inorganic acid substances selected from the group including acid earth, active clay, zeolite and bentonite, (ii) compounds of phenolic resins selected from the group including substituted phenolic compounds selected from the group including p-cresol, p-octylphenol, p-cyclohexylphenol, p-phenylphenol, α-naphthylphenol, cumylphenol and p-chlorophenol, (iii) compounds of phenolic resins selected from the group including phenol-formalin condensation products, and substituted phenol-formalin condensation products; (iv) compounds of phenolic resins modified by high-valence metals selected from the group including zinc and nickel; (v) compounds of aromatic carboxylic acids selected from the group including p-butyl benzoic acid, p-hydroxybenzoic acid, 2,5-dihydroxybenzoic acid, salicylic acid, 5-tert-butyl salicylic acid, 3,5-di-tert-butyl salicylic acid, and 3.5-di(α-methylbenzyl) salicylic acid, and (vi) metal salts of aromatic carboxylic acid compounds, consisting of high-valence metals such as zinc and nickel; (b) ligands selected from the group including 8-quinolinol, gallic acid, dodecyl gallate, 1,10-phenanthroline, o-phenylenediamine diphenylthiourea, guanidine, hydroxynaphthoic acid, dipivaloylmethane, and trifluoroaceylacetone; and (c) metal compounds selected from the group including iron (III) stearate, magnesium stearate, zinc stearate, and zinc N-phenyl-N-ethyldithiocarbamate.

The thermoplastic resin of the instant toner may consist of at least one material selected from the group consisting of: (a) a homopolymer obtained by polymerizing a monomer of (i) styrenes selected from the group including α-methylstyrene, and p-chlorostyrene, (ii) vinyl esters selected from the group including vinyl chloride, vinyl bromide, vinyl propionate, vinyl fluoride, vinyl acetate, vinyl benzoic acid, and vinyl butyrate, (iii) esters of α-methylene aliphatic monocarboxylic acid selected from the group including methyl acrylate, ethyl acrylate, n-butyl acrylate, isobutyl acrylate, dodecyl acrylate, n-octyl acrylate, 2-chloroethyl acrylate, phenylacrylic acid, methyl(α-chloro) acrylate, methyl methacrylate, ethyl methacrylate, and butyl methacrylate, (iv) acrylonitrile, (v) methacrylonitrile, (vi) acrylic amide, (vii) vinyl ethers such as vinylmethyl ether, vinylisobutyl ether, and vinylethyl ether, (viii) vinyl ketones selected from the group including vinylmethyl ketone, vinylhexyl ketone, and vinylisopropenyl ketone, or (ix) N-vinyl compounds selected from the group including N-vinylpyrrole, N-vinylcarbazole, N-vinylindole and N-vinylpyrrolidone; (b) a copolymer obtained by copolymerizing a plurality of monomers selected from (a); (c) a mixture of a homopolymer and a copolymer selected from (a) and (b), respectively; (d) a non-vinyl resin selected from non-vinyl thermoplastic resins selected from the group including rosin-modified phenol-formalin resins, oil-modified epoxy resins, polyurethane resins, and cellulose resins; or (e) a mixture of at least one vinyl resin selected from (a), (b) and (c) and at least one non-vinyl resin selected from (d).

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which:

FIG. 7 is a schematic elevational view of a still further embodiment of the recording system of the present invention; and FIG. 8 is an enlarged fragmentary elevational view in cross section showing a part of the system of FIG. 7, in which hot presser rollers are provided to transfer a developer layer to a recording medium such as a post card.

DETAILED DESCRIPTION OF THE PREFERRED EMBODIMENTS

Figure 1:
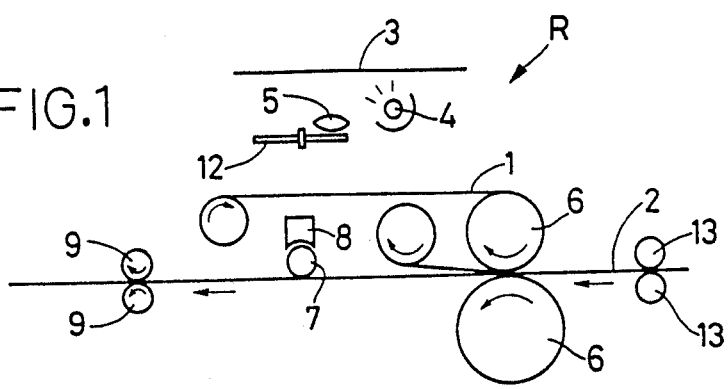
FIG. 1 is a schematic elevational view of one embodiment of a recording system of the present invention.

Referring first to FIG. 1, the recording system is generally indicated at R. The recording system R includes an exposing device which has a halogen lamp 4 for irradiating a color-image original 3, and a lens 5 for converging a radiation reflected from the original 3, so as to image-wise expose a pressure-sensitive photosensitive medium 1 to the reflected radiation, so that latent images are formed on the photosensitive medium 1, according to source image information represented by the images on the color-image original 3.

The photosensitive medium 1 has a layer of radiation-curable microcapsules R, G, B which are sensitive to different wavelengths of light. The exposing device includes a filter device 12 which has three color filters which transmit the rays of light having the different wavelengths to which the three kinds of microcapsules R, G and B are sensitive. Therefore, the photosensitive medium 1 is exposed three times to the reflected radiation from the original 3, with the different color filters of the filter device 12 selectively placed in their operated position.

Figure 2:
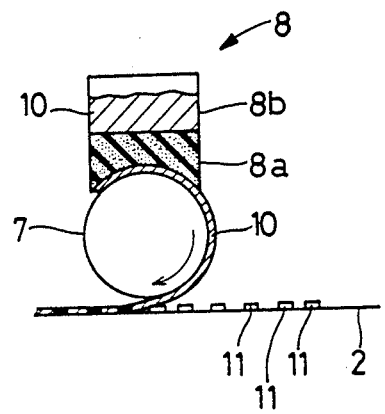
FIG. 2 is an elevational view of a part of the recording system of FIG. 1.

The microcapsules in the exposed areas of the photosensitive medium 1 are radiation-cured, while the microcapsules in the non-exposed areas remain uncured. Thus, the latent images are formed on the photosensitive medium 1. A suitable recording medium 2 is fed through guide rollers 13, 13, such that the image-wise exposed photosensitive medium 1 is superposed on the recording medium 2 in close contact with each other. The superposed photosensitive medium 1 and recording medium 2 are passed through a pressure nip between developing rollers in the form of presser rollers 6, 6. As a result, the non-cured microcapsules are ruptured, whereby a chromogenic material or color precursor 11 comes out of the ruptured microcapsules and adheres to the surface of the recording medium 2, as shown in FIG. 2.

Thus, the latent images are transferred from the photosensitive medium 1 to the recording medium 2, such that the chromogenic material 11 is transferred to local areas of the recording medium 2 which correspond to the non-cured microcapsules on the photosensitive medium 1.

The presser rollers 6 constitute a part of a developing device for developing the latent images which have been formed on the photosensitive medium 1 by the exposing device 4, 5, 12. The developing device further includes a coating device 8 as shown in FIG. 2. The coating device has a coating roller 7 adapted to apply a developer material 10 to the surface of the recording medium 2 to which the latent images have been transferred from the photosensitive medium 1.

As described later in greater detail, the developer material 10 may be a clay mineral, an inorganic acid polymer, a metal salt, an aromatic carboxylic acid, or a mixture of two or more of these substances.

Referring to FIG. 2, the coating device 8 has a reservoir 8b for storing a liquid which contains the developer material 10 dispersed in water. The liquid is fed to the surface of the coating roller 7, through an elastic member 8a made of a sponge, asbestos, cotton or similar material. With the coating roller 7 rotated in rolling contact with the recording medium 2, the developer material 10 is applied to the surface of the medium 2.

As a result, the developer material 10 chemically react with a pattern of the chromogenic material 11 forming the latent images on the recording medium 2, whereby the latent images are eventually developed into the visible color images, as the medium 2 is fed past the coating roller 7.

The recording medium 2 with the visible images formed thereon is then passed through a nip of heat rollers 9, 9, so that the imaged surface of the medium 2 is lustered or glossed.

Figure 3:
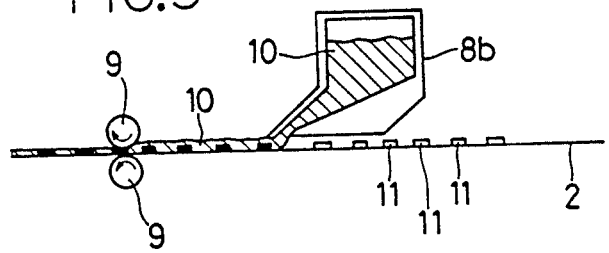
FIG. 3 is a fragmentary view of another embodiment of the invention.

Referring further to FIG. 3, there is illustrated a second embodiment of the invention, wherein the developing material 10 is provided in the form of a powder or toner. In this embodiment, the powdered developer material 10 is delivered onto the surface of the recording medium 2, directly from the reservoir 8b of the coating device. The medium 2 is then passed through the nip of the heat rollers 9, 9, for improving the glossiness of the imaged surface of the medium 2.

Figure 4:
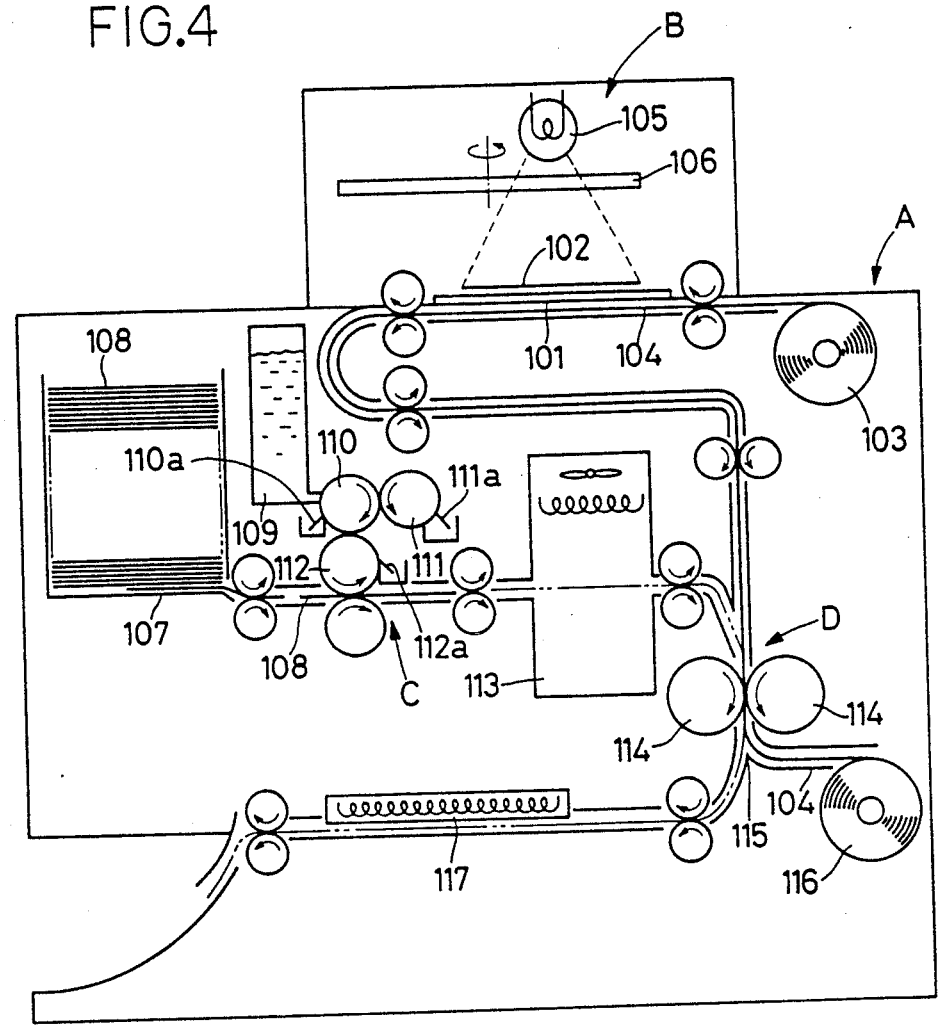
FIGS. 4 and 5 are schematic elevational views of further embodiments of the invention, respectively.

Referring next to FIG. 4, there is generally shown at A a third embodiment of the recording system of this invention. The recording system A includes an exposing device B, a coating device C, and a developing device D. The exposing device B includes a support 101 for supporting an original in the form of a sheet 102, a light source 105, and a color filter device 106. The coating device C includes a reservoir 109 for storing a developer material, a feed roller 110, a metering roller 111, a coating roller 112, and a drying furnace 113. The developing device D includes a pair of presser rollers 114, 114, and a heater 117.

The original sheet 102 bears desired source image information as in the form of photographs, or films having images, characters and graphical representations. The form of the original sheet 102 is more or less limited, depending upon the manner in which the original sheet is irradiated by the exposing device B. The support 101 consists of a colorless transparent sheet which has a thickness not exceeding 100 microns, and which is made of a resin such as polyester, or a glass material. The light source 105 may be a tungsten or halogen lamp, or a similar lamp, which produces a visible spectrum of light having a wavelength range between 400 nm and 700 nm. The color filter device 106 has three filters corresponding to red, green and blue bands of the visible spectrum. With the filter device 106 rotated, the three filters are selectively brought into their operative position right below the light source 105.

A stack of recording media 108 is accommodated in a storage cassette 107. The type of the recording media 108 that can be used on the instant recording system A is not limited to an ordinary cut sheet used for general copying applications. The reservoir 109 stores a developer liquid in the form of a solution or a dispersion which contains at least a developer material and a binder. The developer material that can be used in the present system may be selected from known materials which are used for pressure-sensitive papers suitable for non-carbon duplication. The binder may be a commonly used type such as gelatin or polyvinyl alcohol.

The feed roller 110 of the coating device C is adapted to receive the developer liquid and transfer the liquid to the coating roller 112, and the coating roller 112 is adapted to apply the received liquid to the surface of the recording medium 108 fed from the cassette 107. The metering roller 111 is provided to control the rate of supply of the liquid from the reservoir 109 to the recording medium 108 via the feed and coating rollers 110, 112. Each of the rollers 110, 111, 112 is provided with a cleaning scraper 110a, 111a, 112a, and a receiver for accommodating the liquid removed from the rollers by the scrapers 110a, 111a, 112a.

The drying furnace 113 is provided to dry the developer liquid applied on the recording medium 108. The temperature within the furnace 113 is maintained within a range of 60°-200° C., by a heater and a fan.

The presser rollers 114 of the developing device D are provided to develop latent images formed on a pressure-sensitive photosensitive medium 104. More specifically, the non-cured microcapsules on the photosensitive medium 104 image-wise exposed by the exposing device B are ruptured while the photosensitive medium 104 is passed through the nip of the presser rollers 114, 114, together with the recording medium 108 superposed on the photosensitive medium 104. As described below in detail, the chromogenic material or color precursor flowing from the ruptured microcapsules chemically reacts with the developer material covering the surface of the recording medium 108, whereby visible color images corresponding to the latent images on the photosentive medium 104 are formed on the recording medium 108. The pressure at the nip of the rollers 114 is set to 10kg/cm or higher. The heater 117 is provided to fix the visible images formed on the recording medium, by applying heat to the recording medium 108. The heating temperature is controlled within a range of 50°-200° C. The heater 117 is adapted to be held in contact with the surface of the recording medium 108 opposite to the imaged surface.

An image transfer operation of the recording system A of the present embodiment will be described.

The operation is started with the original sheet 102 set on the support 101. The photosensitive medium 104 is fed from a supply roll 103, so as to pass below the support 101 on which the original sheet 102 is placed. Simultaneously, a radiation emitted from the light source 105 is transmitted through the red color filter of the filter device 106, so that the photosensitive medium 104 is exposed to the rays of light in the red band of the visible spectrum, through the original sheet 102 and the support 101. Thus, the microcapsules corresponding to the red images on the original sheet 102 are exposed. Similarly, the microcapsules corresponding to the blue and green images on the original sheet 102 are exposed to the radiation from the light source 105 through the corresponding blue and green color filters. In the meantime, the recording medium 108 is fed from the cassette 107, and is coated with a 20-micron thick layer of the developer liquid which is supplied from the reservoir 109 via the feed roller 110 and the coating rollers 112. The developer layer applied on the recording medium 108 is dried while being passed through the drying furnace 113 whose operating temperature is set at about 80° C.

The image-wise exposed photosensitive medium 104 and the dried recording medium 108 are superposed on each other such that the exposed surface of the medium 104 and the developer layer of the recording medium 108 are held face to face. The superposed media 108, 104 are then passed through the nip of the presser rollers 114, 114, whereby the latent images on the medium 104 are developed into visible color images on the recording medium 108. After the development, the photosensitive medium 104 and the recording medium 108 are separated from each other by a separator 115. The photosensitive medium 104 is wound on a take-up roll 116, while the recording medium 108 is passed under the heater 117, so that the visible images are fixed and the imaged-surface is glossed. Then, the recording medium 108 is delivered out of the recording system A. Thus, the images are transferred from the original sheet 102 to the recording medium 108, such that the imaged surface of the recording medium 108 has substantially the same glossiness as the imaged surface of the original sheet 102.

Figure 5:
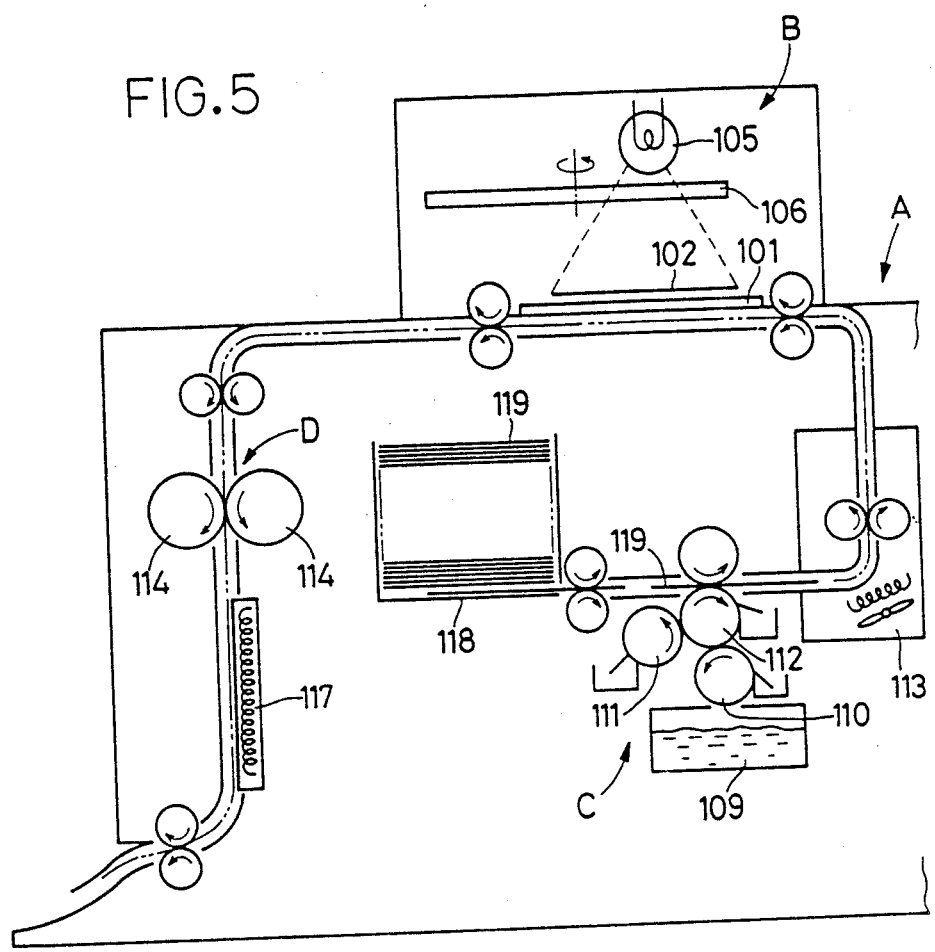

Referring next to FIG. 5, there is shown a fourth embodiment of the present invention. The same reference numerals as used in FIG. 4 will be used in FIG. 5 to identify the corresponding components.

The present embodiment is characterized in that a pressure-sensitive photosensitive medium 119 having a layer of radiation-sensitive microcapsules is coated with a developer layer, and is used as a recording medium on which visible images are eventually formed.

In the instant recording system A, the photosensitive medium 119 in the form of cut sheets is fed from a cassette 118 upon commencement of an image transfer operation with the original sheet 102 set on the support 101. The photosensitive medium 119 fed from the cassette 118 is coated with the developer layer by the coating device C which includes the reservoir 109 and the feed, metering and coating rollers 110, 111, 112 as described above with respect to the third embodiment. The applied developer layer is dried by the drying furnace 113. Thus, the photosensitive medium 119 is processed into a photosensitive recording medium with the developer layer having a thickness of 21 microns. The photosensitive recording medium 119 which has been fed from the furnace 113 is then passed under the support 101, so that the medium 119 is exposed to a radiation from the light source 105 through the original sheet 102 and the support 101, in the same manner as described above in connection with the preceding embodiment. The recording medium 119 is then developed by the presser rollers 114, 114 of the developing device D, whereby visible images corresponding to the images on the original sheet 102 are formed on the recording medium 119. The developed medium 119 is then heated by the heater 117 for fixation of the formed visible images and improved glossiness of the imaged surface. The glossiness of the imaged surface of the medium 119 is substantially the same as that of the imaged surface of the original sheet 102.

While the illustrated embodiments of FIGS. 1–5 use the photosensitive medium 1, 104, 119 whose microcapsules increase their mechanical strength due to curing upon exposure to a radiation, it is possible to use a photosensitive medium of the type in which the microcapsules are softened and their mechanical strength is reduced, upon exposure to a radiation.

Figure 6:
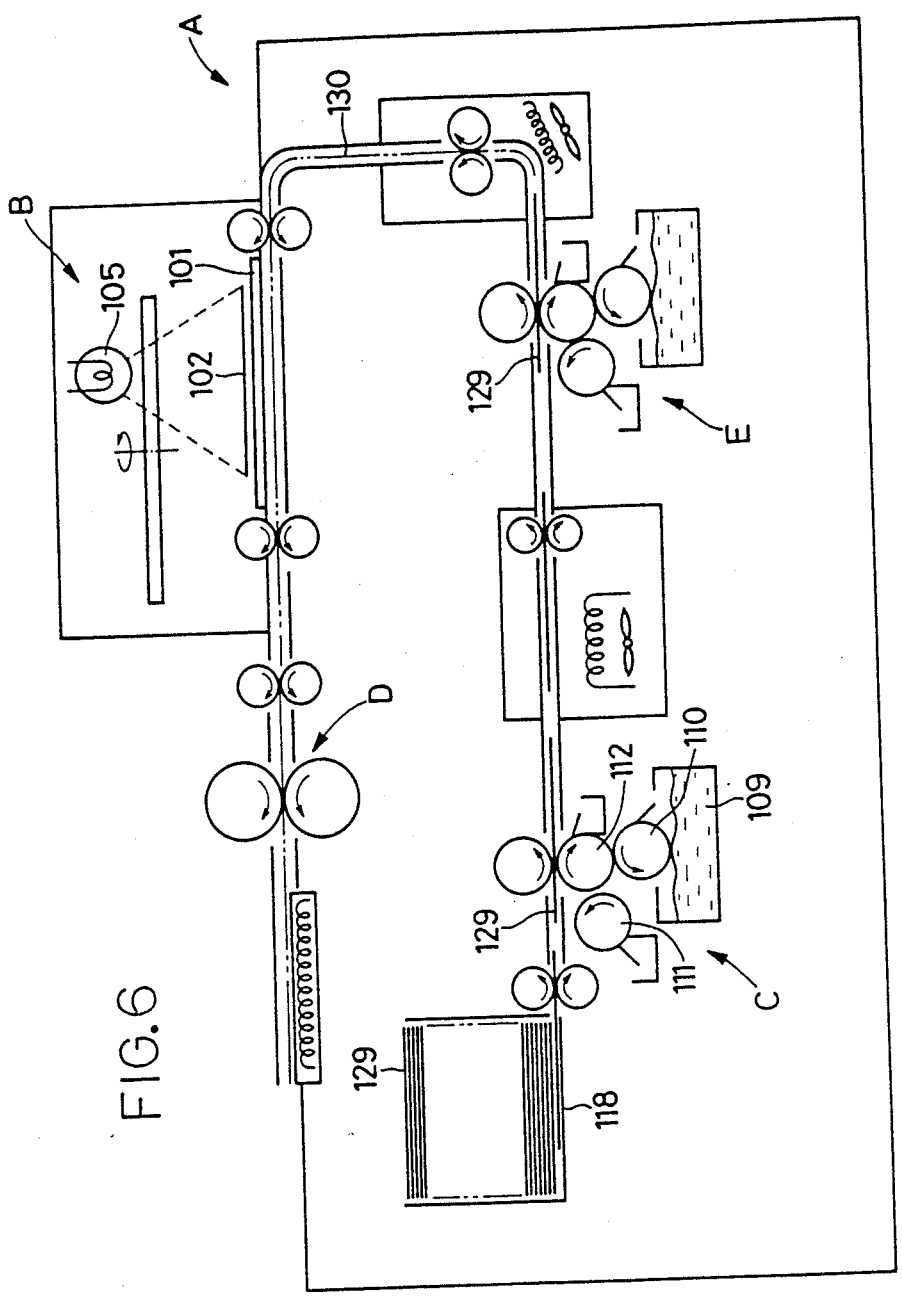
FIG. 6 is a schematic elevational view showing a modification of the embodiments of FIGS. 4 and 5.

A modification of the embodiment of FIG. 5 is shown as a fifth embodiment in FIG. 6. This fifth embodiment incorporates a microcapsule coating device E, as well as the coating device C. Described more specifically, the present recording system uses an ordinary cut sheet 129 which is first coated with a developer layer by the coating device C as described above, and then coated with a layer of microcapsules by the microcapsule coating device E which has substantially the same arrangement as the coating device C. Accordingly, the ordinary cut sheet 129 is processed into a pressure-sensitive photosensitive medium 130 which functions as a recording medium on which visible images are eventually formed.

In this photosensitive medium 130, the microcapsule layer is formed on the developer layer, as distinguished from the recording medium 119 of FIG. 5 in which the developer layer is formed on the microcapsule layer.

A still further embodiment of the present invention will be described, by reference to FIGS. 7 and 8, wherein an image transfer or copying system is generally indicated at 216.

A recording medium 205 such as an ordinary cut sheet, or a postcard or handkerchief, on which the user desires to form images according to source image information, is fed through an inlet 216a of the copying system 216, by feed rollers 218. Initially, the recording medium 205 is humidified by a ultrasonic humidifying device 220, so that the 0.5 gram of water vapor is evenly distributed over a unit area of 100cm$^2$ of the recording medium 205. The humidified medium 205 is then brought into contact with a developer sheet 201, and the thus superposed medium 205 and sheet 201 are passed through a nip of heated presser rollers 204a, 204b, while the medium and sheet 205, 201 are fed together. As illustrated in FIG. 8, the developer sheet 201 consists of a substrate 202 and a developer layer 203 which contains a suitable developer material as described above and as described later in greater detail. While the recording medium 205 and the developer sheet 201 are passed through the nip of the presser rollers 204a, 204b, the developer layer 203 is transferred onto the contacting surface of the recording medium 205, under a pressure exerted by the rollers 204a, 204b. In the present arrangement, the presser rollers 204a, 204b are heated to 80° C. and provide a squeezing pressure of 8kg/cm$^2$. Since the recording medium 205 is pre-humidified, the developer layer 203 is readily transferred to the surface of the medium 205.

The substrate 202 of the developer sheet 201 may be a sheet of paper or PET (polyethylene terephthalate). The developer material contained in the developer layer 203 includes, for example, a clay mineral, organic acid, acid polymer, metal salt, or aromatic carboxylic acid, which is dispersed or dissolved in a solvent, and further includes a binder, a viscosity adjusting agent, and other suitable additives. To form the developer layer 203, the developer material is cast on the substrate 202, by a coating roller, spray, or doctor blade, or other suitable means.

In the meantime, a pressure-sensitive photosensitive medium 209 having a microcapsule layer is fed in a direction indicated by the arrow in FIG. 7 from a supply roll 215, such that the medium 209 is passed under an exposing device 210, 212, and through the nip of presser rollers 213, 213. The medium 209 is finally wound on a take-up roll 214. The microcapsule layer consists of a multiplicity of microcapsules each of which contains a chromogenic material or color precursor capable of reacting with the developer material of the developer layer 203, and a radiation-sensitive material whose mechanical strength is varied upon exposure to a radiation. In operation, a radiation produced by a light source 210 is reflected by the surface of an original 211, and the reflected radiation is converged on the surface of the photosensitive medium 209 by a lens 212. The microcapsules which are exposed to a comparatively large amount of radiation are cured, and their mechanical strength is increased.

After the photosensitive medium 209 is image-wise exposed, the recording medium 205 having the developer layer 203 is transferred onto an exposed length of the medium 209 by a suitable feeding device, such that the developer layer 203 is in contact with the exposed surface of the medium 209. Then, the superposed media 205, 209 are passed through the pressure nip between the presser rollers 213, 213, whereby the microcapsules whose mechanical strength is comparatively small are ruptured. As a result, the chromogenic material flowing from the ruptured microcapsules chemically reacts with the developing material contained in the developer layer 203. Thus, latent images formed on the exposed medium 209 according to the source image information on the original 211 are developed into visible images on the recording medium 205.

Although the illustrated embodiments are adapted to image-wise expose a photosensitive medium to a radiation which is reflected by or transmitted through an original, it is possible that the photosensitive medium is exposed by optical signals fed from a suitable controller according to source image information. In this case, too, the recording medium is superposed on the thus exposed photosensitive medium, and the superposed media are pressed by a suitable developing device. Further, the ultrasonic type humidifying device 220 for applying a water vapor to the recording medium 205 may be replaced by other humidifying means. The humidifying device may be adapted to humidify the developer sheet 201, rather than the recording medium 205. In this case, too, the developer layer 203 may be readily transferred to the recording medium 205.

While the developer layer 203 is transferred from the prepared developer sheet 201 to the desired kind of recording medium 205 in the above embodiment, it is possible to apply a suitable toner directly to a desired recording medium, so as to form a developer medium having a developer layer consisting of the toner, before or after the photosensitive medium is image-wise exposed. Further, the toner may be applied to a photosensitive medium before or after the photosensitive medium is image-wise exposed. For example, the toner may be used in place of the developer material 10 used in the embodiment of FIG. 3 in which the developer material is applied to the recording medium 2 to which the chromogenic material has been transferred from the exposed and pressed photosensitive medium 201.

The toner includes a developer material and a resin material. The following materials capable of chemically reacting with the chromogenic material or color precursor within the microcapsules of a photosensitive medium, so as to produce a color image, may be used as the developer material contained in the instant toner: (a) electron accepter compounds selected from the group which includes (i) inorganic acid substances such as acid earth, active clay, kaoline, zeolite and bentonite, (ii) compounds of phenolic resins including substituted phenolic compounds such as p-cresol, p-octylphenol, p-cyclohexylphenol, p-phenylphenol, α-naphthylphenol, cumylphenol and p-chlorophenol, (iii) compounds of phenolic resins such as phenol-formalin condensation products, and substituted phenol-formalin condensation products, (iv) compounds of phenolic resins modified by high-valence metals such as zinc and nickel, (v) compounds of aromatic carboxylic acids such as p-butyl benzoic acid, p-hydroxybenzoic acid, 2,5-dihydroxybenzoic acid, salicylic acid, 5-tert-butyl salicylic acid, 3,5-di-tert-butyl salicylic acid, and 3.5-di(α-methylbenzyl) salicylic acid, and (vi) metal salts of aromatic carboxylic acid compounds, consisting of high-valence metals such as zinc and nickel; (b) ligands such as 8-quinolinol, gallic acid, dodecyl gallate, 1,10-phenanthroline, o-phenylenediamine diphenylthiourea, guanidine, hydroxynaphthoic acid, dipivaloylmethane, and trifluoroacetylacetone; and (c) metal compounds such as iron (III) stearate, magnesium stearate, zinc stearate, and zinc N-phenyl-N-ethyldithiocarbamate. However, the developer agent that can be used according to the invention is not limited t the materials listed above. The selected developer agent should be included in the toner, in an amount sufficient to produce a color image as a result of reaction with the chromogenic material.

The resins that may be preferably contained in the toner of the invention may include thermoplastic resins which are: (a) homopolymers obtained by polymerizing monomers of (i) styrenes such as styrene, α-methylstyrene, and p-chlorostyrene, (ii) vinyl esters such as vinyl chloride, vinyl bromide, vinyl propionate, vinyl fluoride, vinyl acetate, vinyl benzoic acid, and vinyl butyrate, (iii) esters of α-methylene aliphatic monocarboxylic acid such as methyl acrylate, ethyl acrylate, n-butyl acrylate, isobutyl acrylate, dodecyl acrylate, n-octyl acrylate, 2-chloroethyl acrylate, phenylacrylic acid, methyl(α-chloro) acrylate, methyl methacrylate, ethyl methacrylate, and butyl methacrylate, (iv) acrylonitrile, (v) methacrylonitrile, (vi) acrylic amide, (vii) vinyl ethers such as vinylmethyl ether, vinylisobutyl ether, and vinylethyl ether, (viii) vinyl ketones such as vinylmethyl ketone, vinylhexyl ketone, and vinylisopropenyl ketone, and (ix) N-vinyl compounds such as N-vinylpyrrole, N-vinylcarbazole, N-vinylindole and N-vinylpyrrolidone; (b) copolymers obtained by copolymerizing the above-indicated two or more monomers in combination; (c) mixtures of the above-indicated homopolymers and copolymers; (d) non-vinyl resins including non-vinyl thermoplastic resins such as rosin-modified phenol-formalin resins, oil-modified epoxy resins, polyurethane resins, and cellulose resins; and (e) mixtures of the above-indicated vinyl resins and non-vinyl resins.

EXAMPLE 1

80 parts by weight of copolymer resin of styrene/n-butylmethacrylate having a softening point of 115°–125° C., and 15 parts by weight of copolymer resin of ethylene/vinyl acetate having a softening point of 89° C. were heated to prepare a molten mass. To the prepared molten mass, there was added 20 parts by weight of acid earth. The mixture was evenly kneaded, cooled and then ground. Thus, a toner having an average particle size of 12 microns was obtained.

The obtained toner was electrostatically applied to the surface of an ordinary paper, and then fixed to the paper surface by heat rollers at 120° C. The thus prepared developer sheet and a pressure-sensitive photosensitive sheet having microcapsules containing a chromogenic material were superposed on each other, and the superposed sheets were passed through a nip of developing presser rollers. As a result, latent images formed on the photosensitive sheet were developed into sufficiently colored visible images o the developer sheet.

EXAMPLE 2

50 parts by weight of copolymer resins of styrene/n-butylmethacrylate having a softening point of 115°–125° C., and 45 parts by weight of epoxy resin having a softening point of 90°–94° C. were heated to prepare a molten mass. To the prepared molten mass, there was added 25 parts by weight of phenol-formalin condensation product. The mixture was evenly kneaded, cooled and then ground. Thus, a toner having an average particle size of 10.5 microns was obtained.

The obtained toner was electrostatically applied to the surface of an ordinary paper, and then fixed to the paper surface by heat rollers at 120° C. The thus prepared developer sheet and a pressure-sensitive photosensitive sheet having microcapsules containing a chromogenic material were superposed on each other, and the superposed sheets were passed through a nip of developing presser rollers. As a result, latent images formed on the photosensitive sheet were developed into sufficiently colored visible images on the developer sheet.

While the present invention has been described in its presently preferred embodiments with a certain degree of particularity, it is to be understood that the invention is not limited to the precise details of the illustrated embodiments, but may be embodied with various changes, modifications and improvements, which may occur to those skilled in the art, without departing from the scope of the invention defined in the following claims.

What is claimed is:

1. A recording system, comprising:
   a pressure-sensitive photosensitive medium having a layer of microcapsules whose mechanical strength varies according to an amount of exposure to a radiation, each of said microcapsules containing a chromogenic material capable of chemically reacting with a developer material;
   an exposing device operated according to source image information, for image-wise exposing said layer of microcapsules to said radiation to thereby form thereon latent images corresponding to said source image information, based on variations in said mechanical strength of said microcapsules;
   a coating device for applying said developer material to a recording medium, to thereby prepare a developing sheet; and
   a developing device for superposing said developing sheet on said pressure-sensitive photosensitive medium after said layer of microcapsules have been image-wise exposed, and for applying a pressure to the image-wise exposed layer of microcapsules in contact with said developing sheet, to thereby cause a chemical reaction of said chromogenic material with said developer material, for developing said latent images into visible images on said developing sheet.

2. A recording system according to claim 1, wherein said photosensitive medium is sensitive to different wavelengths of radiation, and said exposing device image-wise exposes said photosensitive medium to said different wavelengths of radiation, to produce color images when said latent images are developed by said developing device.

3. A recording system according to claim 1, wherein said coating device applies to said recording medium a liquid including said developer material.

4. A recording system according to claim 1, wherein said coating device applies to said recording medium a powdered mass including said developer material.

5. A recording system according to claim 1, wherein said coating device includes a removable reservoir for accommodating said developer material.

6. A recording system according to claim 1, wherein said coating device acts on a developer sheet which includes a developer layer containing said developer material and a substrate supporting said developer layer, and further comprises transfer means for transferring said developer layer from said developer sheet to said recording medium, by forcing said developer layer against said recording medium.

7. A recording system according to claim 6, wherein said coating device includes at least one presser roller for forcing said developer sheet against said recording medium while heating said developer sheet and said recording medium.

8. A recording system according to claim 6, further comprising a humidifying device for humidifying at least one of said developer sheet and said recording medium.

9. A recording system according to claim 6, wherein said developer layer is formed from a liquid cast on a surface of said substrate, said liquid containing said developer material in the form of a developer agent capable of reacting with a color precursor on said photosensitive medium, and further containing a binder.

10. A recording system according to claim 1, wherein said pressure-sensitive photosensitive medium consists of a web, while said recording medium consists of a cut sheet.

11. A recording system comprising:
    a pressure-sensitive photosensitive medium having a layer of microcapsules whose mechanical strength varies according to an amount of exposure to a radiation, each of said microcapsules containing a chromogenic material capable of chemically reacting with a developer material;
    a coating device for applying said developer material to said layer of microcapsules of said photosensitive medium, to thereby prepare a recording medium;
    an exposing device operated according to source image information, for image-wise exposing said layer of microcapsules to said radiation to thereby form thereon latent images corresponding to said source image information, based on variations in said mechanical strength of said microcapsules; and
    a developing device for applying a pressure to the image-wise exposed layer of microcapsules of said recording medium, to thereby cause a chemical reaction of said chromogenic material with said developer material, for developing said latent images into visible images on said recording medium.

12. A recording system according to claim 11, wherein said photosensitive medium is sensitive to different wavelengths of radiation, and said exposing device image-wise exposes said layer of microcapsules of said photosensitive medium to said different wavelengths of radiation, to produce color images when said latent images are developed by said developing device.

13. A recording system according to claim 11, wherein said coating device applies to said layer of microcapsules of said photosensitive medium a liquid including said developer material.

14. A recording system according to claim 11, wherein said pressure-sensitive photosensitive medium consists of a cut sheet.

15. A recording system comprising:
    a coating apparatus for forming a layer of microcapsules and a layer of a developer material one on another on a recording medium, each of said microcapsules having a mechanical strength which varies according to an amount of exposure to a radiation, said each microcapsule containing a chromogenic material capable of chemically reacting with a developer material;

an exposing device operated according to source image information, for image-wise exposing said layer of microcapsules to said radiation to thereby form thereon latent images corresponding to said source image information, based on variations in said mechanical strength of said microcapsules; and a developing device for applying a pressure to the image-wise exposed layer of microcapsules on said recording medium, to thereby cause a chemical reaction of said chromogenic material with said developer material, for developing said latent images into visible images on said recording medium.

16. A recording system according to claim 15, wherein said layer of microcapsules formed on said recording medium is sensitive to different wavelengths of radiation, and said exposing device image-wise exposes said layer of microcapsules to said different wavelengths of radiation, to produce color images when said latent images are developed by said developing device.

17. A recording system according to claim 15, wherein said coating device applies to said recording medium a liquid including said developer material.

18. A recording system according to claim 15, wherein said recording medium consists of a cut sheet.

19. A recording system according to claim 15, wherein said coating apparatus comprises a coating device for applying said developer material to said recording medium to form thereon said layer of developer material, and a device for forming said layer of microcapsules on said layer of developer material.

* * * * *